United States Patent

Winnerl et al.

[11] Patent Number: 5,846,879
[45] Date of Patent: Dec. 8, 1998

[54] CONTACT STRUCTURE FOR VERTICAL CHIP CONNECTIONS

[75] Inventors: Josef Winnerl; Johann Alsmeier; Walter Neumüller, all of München, Germany

[73] Assignee: Siemens Aktiengesellschaft, Munich, Germany

[21] Appl. No.: 545,647

[22] PCT Filed: May 3, 1994

[86] PCT No.: PCT/DE94/00492

§ 371 Date: Nov. 3, 1995

§ 102(e) Date: Nov. 3, 1995

[87] PCT Pub. No.: WO94/25982

PCT Pub. Date: Nov. 10, 1994

[30] Foreign Application Priority Data

May 5, 1993 [DE] Germany ............... 43 14 913.8

[51] Int. Cl.[6] .................................................. H01L 23/498
[52] U.S. Cl. ..................... 430/666; 438/674; 438/675; 438/667
[58] Field of Search .................. 257/723, 692, 257/697; 438/674, 666, 667, 675, 742

[56] References Cited

U.S. PATENT DOCUMENTS 4,394,712  7/1983  Anthony ......................... 361/411
5,574,311  11/1996  Matsuda ......................... 257/697

FOREIGN PATENT DOCUMENTS

| 0 238 089 | 9/1987 | European Pat. Off. . |
| 0238089 | 9/1987 | European Pat. Off. . |
| 0270067 | 6/1988 | European Pat. Off. . |
| 0516866 | 12/1992 | European Pat. Off. . |
| 92/03848 | 3/1992 | WIPO . |
| 94/05039 | 3/1994 | WIPO . |

*Primary Examiner*—Tom Thomas
*Assistant Examiner*—Roy Potter
*Attorney, Agent, or Firm*—Hill & Simpson

[57] ABSTRACT

A semiconductor component having a contact structure for making vertical contact with further semiconductor components and having a substrate (15) which has on a top side with a layer structure having regions with which contact is to be made, includes at least one metal pin (8) which penetrates the substrate (15) perpendicularly with respect to the layer structure. The substrate (15) is thinned until the metal pin (8) projects beyond the underside of the substrate. Metal contacts (12) made of metal having a low melting point are present, if appropriate, on the top side of the component.

5 Claims, 5 Drawing Sheets

CONTACT STRUCTURE FOR VERTICAL CHIP CONNECTIONS

BACKGROUND OF THE INVENTION

1. Field of the Invention

The present invention relates to semiconductor components having a special contact structure which is provided for vertical, electrically conductive connection of a plurality of semiconductor components. In addition, associated production processes are specified.

2. Description of the Related Art

Semiconductor circuits are produced nowadays using planar technology. The achievable complexity on a chip is limited by its size and the achievable fineness of the structure. The performance of a system comprising a plurality of semiconductor chips connected to one another is considerably limited in the case of conventional technology by the limited number of possible connections between individual chips via connection contacts also referred to as (pads), the low speed of signal transfer via such connections between different chips for example, using an (interface circuit pad/printed circuit board), the limited speed in the case of complex chips due to extensively branched conductor tracks, and the high power consumption of the interface circuits.

These evinced limitations in the use of planar technology can be overcome using three-dimensional interconnection techniques. The arrangement of the functional planes above one another allows parallel communication between these components with a low requirement for electrically conductive connections in one plane, and speed-limiting interchip connections are additionally avoided.

A known process for producing three-dimensional ICs is based on depositing a further semiconductor layer (for example silicon) over a plane of components, recrystallizing the layer using a suitable process (for example local heating by means of a laser) and implementing therein a further component plane. This technique, too, has considerable limitations as a result of the thermal loading of the lower plane during recrystallization and the achievable yield which is limited by defects.

An alternative process from NEC produces the individual component planes separately from one another. These planes are thinned to a few μm and connected to one another by means of wafer bonding. The electrical connections are produced by providing the front and rear sides of the individual component planes with contacts for interchip connection. This process has the following disadvantages and limitations: the thinned wafers must be processed on the front side and on the rear side using technical processes for example, using (lithography with adjustment by the semiconductor wafer). Testing for functionality of the individual planes prior to assembly is made more difficult by the fact that in this process individual components, but not complete circuits, are implemented in each plane. By thinning the wafers right down to the functional elements, SOI-like component structures are produced, with the result that use cannot be made of wafers which have been preproduced using standard technologies (for example standard CMOS).

SUMMARY OF THE INVENTION

An object of the present invention is to provide semiconductor components having a contact structure which is suitable for three-dimensional contact-making, is easy to produce and is improved in comparison with previous interconnections, and associated production processes.

This and other objects and advantages of the invention are achieved by means of the semiconductor components having a contact structure in which a vertical contact with further semiconductor components is formed, the components having a substrate which has a layer structure on a top side and at least one metal pin which penetrates the substrate perpendicularly with respect to the top side, the metal pin being in electrical contact with at least one contact layer made of semiconductor material or a metallic conductor track or a metal contact on the top side, the metal pin touching the contact layer, the conductor track or the metal contact, or the conductor track or the metal contact being fitted to one end of the metal pin, and the metal pin projecting beyond the underside, opposite to the top side, of the substrate to such an extent that it can be electrically conductively connected to a metal contact provided therefor of a further semiconductor component if the further semiconductor component with the metal contact is aligned toward the metal pin on the underside. Further refinements, in particular production processes, provide that there is present on the layer structure a metal contact which has a lower melting point than that of conductor tracks and is provided for the electrically conductive connection to a metal pin on the underside of a further semiconductor component. The semiconductor component, in which at least one metal pin and at least one metal contact are present, in such a way that two identical semiconductor components provided with this contact structure can be arranged vertically with respect to one another in such a way that the metal pin of the one semiconductor component can be electrically conductively connected to the metal contact of the other semiconductor component. The substrate is preferably an oxide layer and the semiconductor component is stabilized on the layer structure with an adhesion layer and a carrier wafer.

A process for producing a contact structure of a semiconductor component provides in a first step that the layer structure is produced on the top side of a substrate to such an extent that a contact layer, which is made of semiconductor material and with which a metal pin is to make contact, or a conductor track or a metal contact is present, in a second step, using a mask, the layer structure and the substrate are removed in anisotropic etching steps from the top side toward the underside in the region of the metal pin to be produced, in a third step metal is introduced into this region, and in a fourth step the underside of the substrate is removed until the metal pin produced in the third step projects beyond the underside as envisaged.

The process is further defined in which in the first step use is made of a substrate comprising two layers of semiconductor material which are isolated by an insulator layer which is arranged to be coplanar with the top side, in the second step the region provided for the metal pin is etched at least as far as the layer of semiconductor material forming the underside of the substrate, and in the fourth step the layer of semiconductor material is completely removed by etching the semiconductor material selectively with respect to the insulator layer. Preferably, the substrate is an SOI substrate, in the first step envisaged functional elements are produced in the thin silicon layer of the substrate and then a first dielectric layer is applied over the whole area, between the third and the fourth step a second dielectric layer is applied over the whole area and planarized, openings are produced, using a mask technique, as contact holes in the second dielectric layer, the contact holes are filled with metal and then conductor tracks or metal contacts are produced in a third dielectric layer.

The process as set forth above provides that a metal pin for making contact with a conductor track or a metal contact is produced by carrying out the second step in such a way that in a first further step a planarization layer made of a dielectric is applied, in a second further step the region provided for the metal pin is etched out, using a mask, right up to and including the conductor track or the metal contact, in a third further step the sides of this etched-out region are provided with a passivation layer, in a fourth further step the region provided for the metal pin is etched out completely, in a fifth further step the sides of the etched-out region are coated with a dielectric, and in a sixth further step the dielectric is removed, using a mask, in the region of the conductor track or of the metal contact.

The sequence of process steps for producing a metal pin of the contact structure is carried out repeatedly for making contact between different planes of the layer structure.

In the case of the semiconductor component according to the invention, the contact structure has metal pins which are electrically conductively connected to regions with which contact is to be made of a layer structure arranged on the top side of a substrate and having functional elements, completely penetrate the substrate and project beyond the opposite side, or underside of the substrate to such an extent that an electrically conductive connection of these metal pins to metal contacts on the top side of a further semiconductor component is possible. In the case of the semiconductor component according to the invention and the associated production process, use can be made of wafers which have been preproduced using standard technologies. It is not necessary to intervene in the customary basic technologies since the modification, necessary for the vertical connection, of the contact structure is carried out in process steps at the end of the production process. The electrical contacts are produced on the front and rear sides of the component exclusively by means of production processes which are carried out from the front or rear side of the component. Therefore, the inventive structure of the semiconductor component and the associated production processes are particularly suitable for implementing complex systems having a high requirement for electrical connection. The individual semiconductor planes connected vertically to one another do not have to be purely component planes, rather they are preferably entire circuit planes which can be preproduced using standard technologies (for example CMOS, bipolar technology or memories with multilayer metallization). This means that the individual circuit planes can be tested prior to the assembly of the semiconductor components according to the invention which are arranged vertically with respect to one another, as a result of which the yield is increased because only correctly functioning components are combined with one another. It is also possible to produce sensors or actuators in the form of semiconductor components according to the invention. The semiconductor component according to the invention can be produced particularly simply using a process (such as, for example, CMOS) which guarantees a low power loss of the chip as a result of a low supply voltage, is planar (including multilayer metallization) in order to permit connection of the individual planes by means of wafer bonding and not to necessitate special and costly subsequent planarization, permits free placement of the interlayer connections, uses standard microelectronic processes for producing the connections and, if appropriate, permits the use of special materials, such as a metal having a low melting point, at the end of the process.

The process for producing three-dimensionally integrated chips using the semiconductor components according to the invention is modular, that is to say the individual planes can, in a mutually independent manner, be produced, tested and then connected to one another. The individual planes can take the form not only of CMOS circuit planes but also of circuit planes which are produced using other technologies and are constructed in accordance with the above-listed properties of the process used (for example bipolar or memories such as DRAM, SRAM or nonvolatile memories). It is also possible to arrange between the partial circuit planes planes having no active components as straightforward interconnection planes. Described below are exemplary embodiments of the semiconductor component according to the invention and of the associated production processes which can be modified slightly and adapted to the respective specific requirements.

BRIEF DESCRIPTION OF THE DRAWINGS

There follows the description of the components according to the invention and of the production processes with reference to FIGS. 1 to 13.

DETAILED DESCRIPTION OF THE PREFERRED EMBODIMENTS

Figure 1:
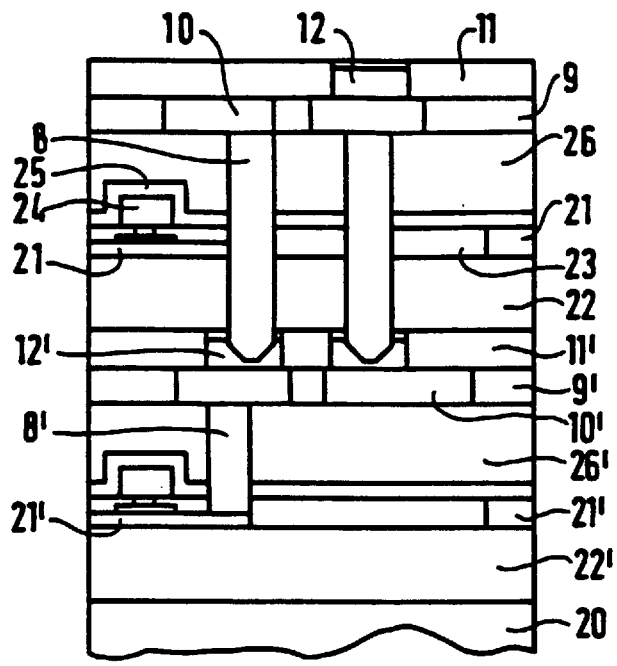
FIGS. 1 and 2 each show a detail of a cross section through two semiconductor components according to the invention which are connected vertically to one another.

FIG. 1 partially illustrates a cross section of two semiconductor components according to the invention which are arranged vertically with respect to one another and are electrically conductively connected to one another. With regard to the production process, it is particularly advantageous if a three-layer substrate is used for the component according to the invention. In the case of this substrate, two semiconductor layers are isolated from one another by an insulator layer. In this case, the substrate may be, for example, an SOI substrate (silicon on insulator). The semiconductor component according to the invention carries the functional elements only on one side, the top side, of the substrate. When using three-layer substrates, the semiconductor layer which is opposite to the top side is expediently completely removed, with the result that the insulator layer is exposed on the underside. In order that the functional elements are not impaired by the plane respectively situated underneath when vertically connecting different semiconductor chips, it can be advantageous if the insulator layer is substantially thicker than is normal in the case of SOI substrates. A thick oxide layer may be provided, for example, as the insulator layer, it being possible to produce the threelayer substrate by means of wafer bonding. In the event of using an SOI substrate, only the insulator layer 22 and the thin silicon layer 21 remain of the upper semiconductor component illustrated in FIG. 1. However, the layer 21 can also be a semiconductor layer structure which is grown onto a conventional substrate. Equally, the insulator layer 22 can be a correspondingly thicker layer of a multilayer substrate. In the case of the lower semiconductor component in FIG. 1, the bottom semiconductor layer of the substrate is partially illustrated as a carrier wafer 20 of an SOI substrate. As an example, in this exemplary embodiment of FIG. 1, a field-effect transistor is formed in the silicon layer 21 (or generally a semiconductor layer structure). The gate metallization layer 24 above the transistor is likewise illustrated. This layer structure made of semiconductor material can have one layer or more than one layer. Different conductive regions made of semiconductor material can be isolated by means of insulation regions 23 arranged therebetween. In addition, a single-layer or likewise a multilayer metallization layer structure may be present. In FIG. 1, this metallization layer structure is restricted to the gate metallization layer 24 for the sake of clarity. In this exemplary embodiment, a first dielectric layer 25 and a second dielectric layer 26 are arranged between the layer structure made of semiconductor layer and metallization planes and the plane provided for the conductor tracks. The conductor tracks 10 are insulated from one another by a third dielectric layer 9. Situated on the conductor tracks 10 in the example of FIG. 1 is a metal contact 12 in a covering layer 11 made of dielectric. This metal contact 12 can be used, for example, to make electrical contact with a further semiconductor component arranged above this component. The manner in which this contact-making takes place in a vertical arrangement is to be inferred from the connection of the upper semiconductor component to the lower semiconductor component in FIG. 1. Electrically conductive contact layers made of semiconductor material, further conductor tracks or metal contacts in different metallization planes (in the example of FIG. 1 a contact layer of the FET made of silicon) are connected to the conductor tracks 10 or to the metal contacts 12 by means of metal pins 8 extending perpendicularly with respect to the top side of the substrate. These metal pins 8 penetrate the substrate or the insulator layer 22 left over from the substrate and project beyond the underside thereof. A further component is arranged on the underside in such a way that when the chips are assembled, the ends of the metal pins 8 enter into electrically conductive connections with the corresponding metal contacts 12' of the lower component. The lower component has a similar structure to the upper component. A field-effect transistor is formed in the silicon layer 21' on an SOI substrate 20, 21', 22'. This field-effect transistor is electrically conductively connected to a conductor track 10' by means of a corresponding metal pin 8'. The plane of the conductor tracks 10' is again isolated from the plane of the silicon layer 21' by layers of dielectric 26'. The metal contacts 12' for the vertical conductive connection are fitted to the conductor tracks 10'. The covering layer 11' serves to planarize the surface and facilitates the vertical connection of the two semiconductor components. Since the lower component is provided as the bottom component in this example, the carrier wafer 20 of the substrate is present and the insulator layer 22' is not penetrated by the metal pin 8'.

Figure 2:
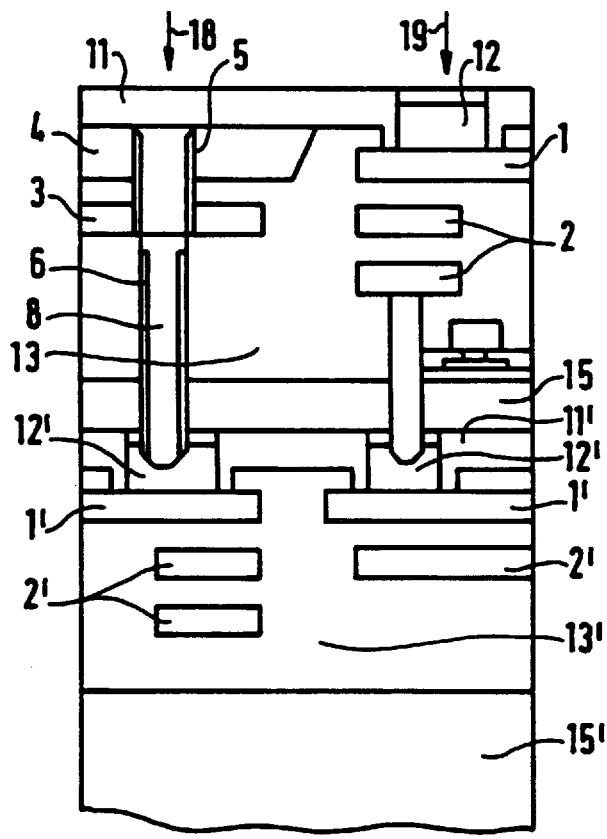

In a manner analogous to the illustration in FIG. 1, FIG. 2 partially illustrates a cross section of two semiconductor components, which are placed vertically one above the other, of a further embodiment according to the invention. A layer structure having functional elements is situated on a substrate 15, which may be a single-layer semiconductor wafer or the insulator layer or oxide layer of an originally multilayer substrate. By way of example, FIG. 2 illustrates a layer structure which is grown on epitaxially for a field-effect transistor having a gate metallization layer applied thereto. Situated on the substrate 15 and the functional elements applied thereto or integrated therein is an interlayer 13 made of dielectric, to or in which one or more metallization planes having conductor tracks are applied or embedded. FIG. 2 illustrates an upper metal plane 1 and also further metal planes 2 underneath. A metal pin 8 which penetrates the substrate 15 and is used to conductively connect the conductor track 3 to a semiconductor component arranged vertically underneath is isolated from the substrate 15 and a portion of the interlayer 13 by a dielectric 6. Situated between the conductor track 3 and the metal pin 8 is a conductive passivation layer 5, which prevents contamination of the substrate 15 with the metal of the conductor track 3 during the production of the metal pin 8. A further metal pin is illustrated on the right-hand side of FIG. 2. Both metal pins are electrically conductively connected to the metal contacts 12' of a further semiconductor component arranged underneath. The parts of this further semiconductor component which are illustrated are a top metal plane 1' and further metal planes 2' underneath in an interlayer 13'. A covering layer 11' made of dielectric planarizes the top side, facing the upper component, between the metal contacts 12'. The interlayer 13 of the upper semiconductor component is levelled in the example illustrated by a planarization layer 4 made of dielectric. Situated on the right-hand side (see arrow 19) on the upper semiconductor component is a metal contact 12 on the top metal plane 1. The surface is levelled by a covering layer 11. The metal contact 12 is made of a metal having a lower melting point than the metal of the conductor tracks 1. This metal contact 12 is used for electrically conductive connection to a metal pin arranged above of a further semiconductor component to be connected vertically. The metal of the metal contact 12 has a lower melting point because the conductive connection between the metal contact 12 and the metal pin 8 is produced by heating and in this case it is intended that the reaction temperature remain sufficiently low such that the conductor tracks 1, 2, 3 and the rest of the metallization layers are not impaired thereby. In the case of conductor tracks made of aluminum, the metal contact 12 can be, for example, AuIn.

Figure 3:
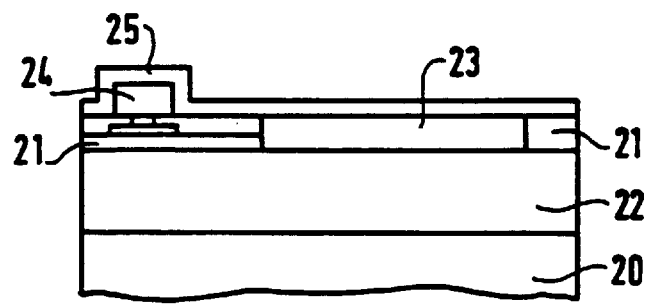
FIGS. 3 to 7 each show a detail of a cross section through a semiconductor component according to the invention after different steps of an associated production process.
Figure 4:
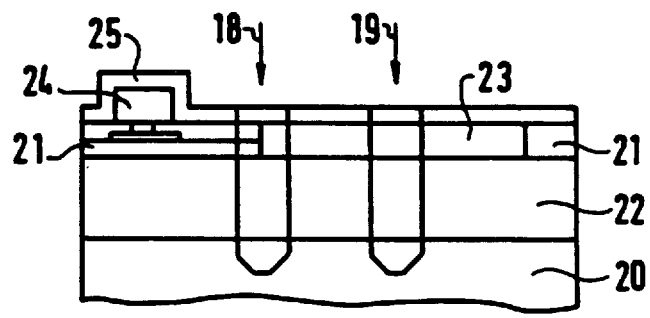
Figure 5:
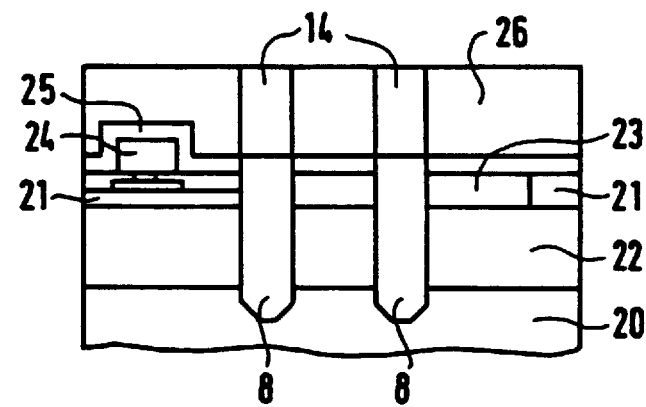

The details of the exemplary embodiment of FIG. 1 are explained in more detail below using the description of a production process. As starting material, use can be made, for example, of an SOI substrate having a silicon layer 21, which has a thickness of at most 100 nm, on an insulator layer 22 (for example oxide) on a carrier wafer 20 (for example silicon). An SoI substrate of this type can be produced using known processes such as wafer bonding or SIMOX. The functional elements (the active components of this component) are produced in the silicon layer 21 using a technology for low power losses, such as, for example, SOI-CMOS for fully depleted MOSFETs. The individual functional elements such as, for example, the field-effect transistors are isolated from one another by insulation regions 23. These insulation regions 23 are produced, for example, by removing the silicon layer 21 between the functional elements and filling these regions with an oxide. Local oxidation of these regions or insulation implantation can be carried out instead. A necessary doping of the functional elements by ion implantation, for example for setting the starting voltage for MOSFETs, can subsequently take place. The dielectric for the insulation of the gate in the case of the MOSFET can be produced, for example, as a thermal oxide by means of RTP (Rapid Thermal Processing). Necessary metallization layers, such as, for example, the gate metallization layer 24 illustrated in FIG. 3, made, for example, of doped polysilicon or metal or metal silicide are subsequently applied. After the structuring of the gate, doping materials can again be diffused in order to produce the regions for the source and drain by means of ion implantation and subsequent activation (annealing). Other functional elements are also produced correspondingly using the available basic technology. Moreover, semiconductor layers can also be grown epitaxially on the substrate. A layer structure is produced in this way on the top side of the substrate in the first section of the production process. This layer structure contains the active regions having the functional elements and one or more contact-making planes. These contact-making planes can be formed, for example, by contact layers made of semiconductor material which is highly doped for good low-resistance metal/semiconductor contact, or by a metal plane having conductor tracks which are insulated from one another by dielectrics, or by individually applied metal contacts. For the purpose of simplification, only one MOSFET in this layer structure is illustrated in the exemplary embodiment. As illustrated in FIG. 3, a first dielectric layer 25 is applied over the whole area in a following process step. In FIG. 4, two different arrangements for the metal pins of the contact structure to be produced are designated by a left-hand arrow 18 and a right-hand arrow 19. The regions for the metal pin to be produced are in each case etched out. In this case, the dielectric of the first dielectric layer 25, of the insulation region 23 and of the insulator layer 22 can be etched away in the at the right-hand example (right-hand arrow 19) in FIG. 4. The material of the carrier wafer 20 (for example silicon) is then etched out as illustrated. In the example drawn on the left (left-hand arrow 18), given the use of selective etchants for the oxide or other material of the dielectric layers and for the silicon or other semiconductor material of the active regions and of the carrier wafer 20, a different etching agent is alternately used in each case. The carrier wafer 20 is in each case etched out to the extent envisaged for the length of the metal pin projecting from the subsequently thinned substrate. The etched-out regions are then filled with metal 8 (see FIG. 5), and this can be done, for example, by depositing the metal (for example tungsten) over the whole area by means of CVD and etching back the metal on the surface. A second dielectric layer 26 is then deposited over the whole area and planarized. This planarization is done, is for example, by depositing a planarizing auxiliary layer (such as, for example, spin-on glass) and etching back or by chemical mechanical polishing. Openings 14 are then produced in this second dielectric layer 26 above the metal 8 which has been introduced.

Figure 6:
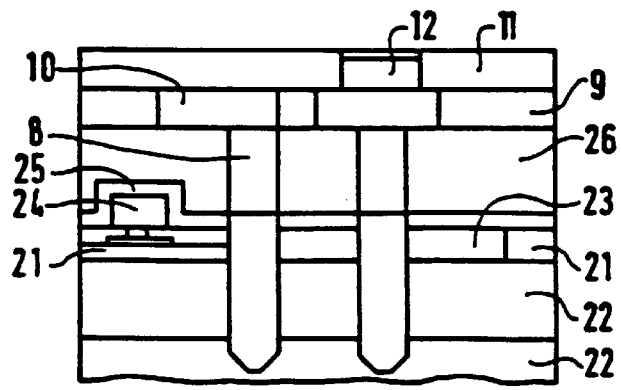
Figure 7:
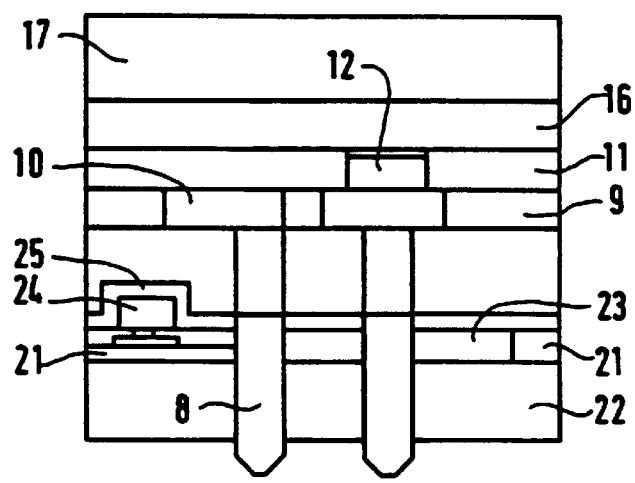

The openings 14 in the second dielectric layer 26 are likewise filled with metal. A metal plane containing, for example, conductor tracks or individual metal contacts is produced on the second dielectric layer 26. In this case, the second dielectric layer 26 defines the distance of this metal plane from the active regions. The metal pins 8 are accordingly lengthened as far as the surface of the second dielectric layer 26. In addition to the illustrated openings 14, which expose the lower part of the metal pins 8 to be produced, further openings can be provided in order to be able to make contact with individual regions of the layer structure from above. Since it is primarily the contact structure with metal pins 8 which is critical for the semiconductor component according to the invention, further instances of making contact are not illustrated in the figures for the sake of clarity. As drawn in FIG. 6, the conductor tracks 10, for example, are applied to the second dielectric layer 26 and structured such that they are electrically conductively connected, as envisaged, to the metal in the contact holes (in this example the metal pins 8). A third dielectric layer 9 is applied between the conductor tracks 10 for the purpose of insulation and planarization. This third dielectric layer 9 can also initially be applied to the second dielectric layer 26 and structured. The regions provided for the conductor tracks 10 are removed from the third dielectric layer 9. These openings in the third dielectric layer 9 are then filled with metal as in the case of the production of the metal pins 8, and this can also be done here by selective CVD deposition (for example of tungsten on an adhesion layer) or by deposition over the whole area and etching back by means of RIE (reactive ion etching) or chemical mechanical polishing. Further dielectric layers can then be applied and structured, corresponding to the number of required metallization planes. In this way, a plurality of planes of conductor tracks and metal contacts can be arranged one above the other, and they are mutually isolated in each case by dielectric layers situated therebetween. These dielectric layers can also in each case be filled further with metal in the regions of the metal pins 8, with the result that the metal pins 8 can be lengthened as far as metal planes arranged further above the pins. As an alternative to this, it is possible to provide a metal plane arranged further above the pins with a metal pin of the contact structure according to the invention, as is described further below using the exemplary embodiment of FIG. 2. FIG. 6 also illustrates a covering layer 11 made of dielectric and having a metal contact 12, situated therein, on the top side. This metal contact 12 can be applied, for example, using a customary photoresist technique. Instead, the covering layer 11 can initially be applied over the whole area and structured. The metal of the metal contact 12 is then applied by vapor deposition or sputtering. In this case, a metal having a lower melting point than the metal of the conductor tracks is applied. The metal contact 12 is used for connection to a corresponding metal pin of a further component according to the invention which is arranged vertically with respect to this component. Connection of this further metal pin 8 to the metal contact 12 takes place by heating. In order that it is possible for the reaction temperature for this vertical connection of the contact structures to be sufficiently low, and in order that the load for the conductor tracks and metallization layers which are present is kept low, a metal having a lower melting point is provided for the metal contact 12. In the case of conductor tracks made of aluminum, the metal of the metal contact 12 can be, for example, AuIn. Excess metal, material of the mask or materials used in the lift-off process are removed. An adhesion layer 16 and a carrier wafer 17 are applied as shown in FIG. 7. The carrier wafer 17 serves to stabilize the component. The substrate is then thinned from the rear side, and this is done in this exemplary embodiment by removing the semiconductor material (silicon) of the carrier wafer 20 selectively with respect to the material (oxide) of the insulator layer 22. This is done, for example, by wet-chemical etching back. The result is the structure illustrated in FIG. 7. The semiconductor wafer, together with this stabilization layer comprising adhesion layer 16 and carrier wafer 17, is divided into chips. The individual chips are aligned with a prepared first chip or with a stack of a plurality of chips and attached to one another at elevated temperature and under pressure. In this case, the individual metal contacts 12 and metal pins 8 enter into a respective connection with one another. It is also possible to carry out the connection before the division of the chips. However, in this case preselection of functional chips, and hence an increase in yield, is not possible. Before vertical contact is made with a further semiconductor component on the top side of the component, the adhesion layer 16 and the carrier wafer 17 thereon are removed.

In a stack of a plurality of semiconductor components according to the invention which are arranged one above the other, for the bottom plane, only metal contacts must be produced on the top side and the substrate does not need to be thinned. The top plane is provided only with metal pins 8, that is to say the contact structure according to the invention does not have any metal contacts 12 on the top side. The semiconductor components arranged in between each have a contact structure with metal contacts on the top side and metal pins projecting from the thinned substrate on the underside.

Semiconductor components with no active components, that is to say without any functional elements, can also be implemented using the process according to the invention. Semiconductor components of this type are then used exclusively for the conductive connection between further components which are arranged vertically with respect to one another. Combinations with further technologies, such as the technologies for producing bipolar transistors and memories, are also possible. In order to produce corresponding components, layer structures are to be implemented for these corresponding components and then to be provided with the contact structure according to the invention, as described.

Figure 8:
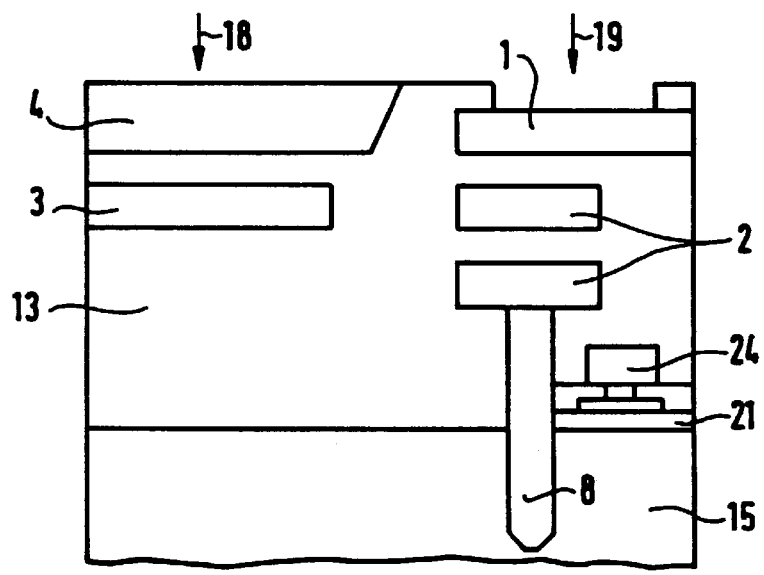
FIGS. 8 to 13 each show details from the cross section of another embodiment of the semiconductor component according to the invention after different steps of another associated production process.
Figure 9:
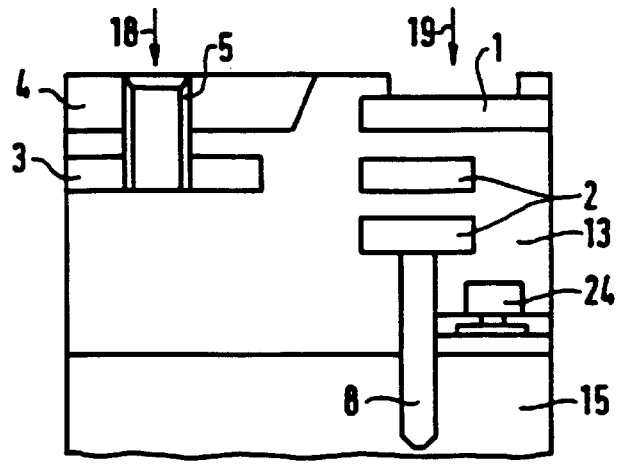
Figure 10:
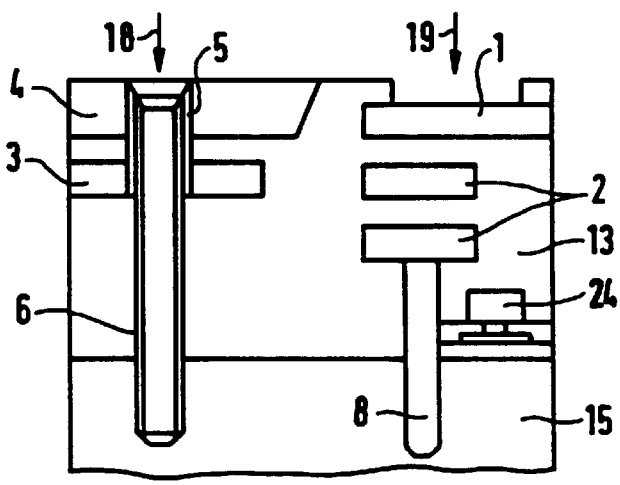
Figure 11:
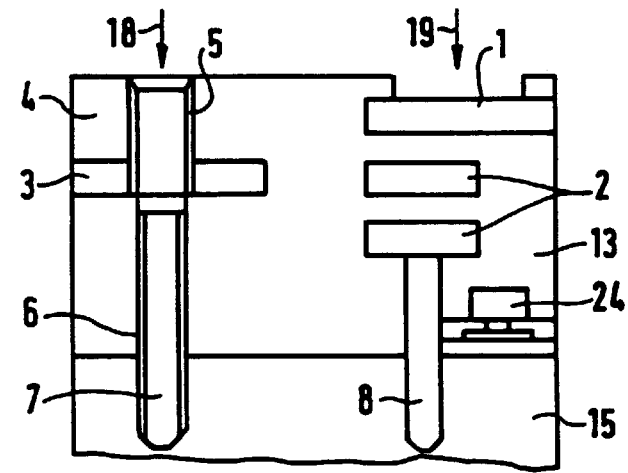

In the exemplary embodiment of FIG. 2, the starting point is a substrate having a layer structure and, for example, a plurality of metallization planes (for example CMOS with multilayer metallization) and having a passivation layer (for example oxide, nitride), in the case of which substrate the passivation layer is opened via test pads in order to be able to perform selection for increasing the yield. FIG. 8 illustrates, as an example, on the substrate 15 a layer sequence 21 made of semiconductor material for forming a FET having a gate metallization layer 24. At least one metallization plane is formed in an interlayer 13, which may be multilayered. In FIG. 8, a top metal plane 1 is situated above further metal planes 2. These may be individual contacts or conductor tracks. A lower metal plane of these further metal planes 2 is already provided with a metal pin 8 of the contact structure according to the invention. This metal pin 8 can be produced, for example, as in the preceding exemplary embodiment. In the production process described now, a further metal pin is subsequently produced, by means of which a metal plane 3 which is already present and with which contact remains to be made is also included in the contact structure according to the invention. If the surface of the component does not have adequate planarity, a planarization layer 4 made of dielectric (for example oxide deposited by means of PECVD) is applied to the interlayer 13. If appropriate, planarizing etching back is necessary for this purpose. Starting with the structure of FIG. 8, the metal pin 8 for the vertical contact-making is produced on the left-hand side (arrow 18). For this purpose, a mask is applied, for example using a photographic technique, and the interlayer 13, if appropriate including the passivation layer 4, is removed within the mask opening selectively with respect to the metal of the metal plane 3 with which contact is to be made. The metal is then likewise etched selectively with respect to the material of the interlayer 13. The upper part of the cylindrical region provided for the metal pin is thus obtained. It is provided on the inside with a passivation layer 5 (see FIG. 9) (for example electrically conductively doped polysilicon) in order, in following process steps, to protect the semiconductor material (silicon) of the substrate 15 against contamination with metal from the metal plane 3 with which contact is to be made. The passivation layer 5 is removed by anisotropic etching from the surface of the interlayer 13 or of the planarization layer 4 and from the bottom of the etched region. The material (for example oxide) of the interlayer is etched anisotropically and selectively with respect to the silicon of the substrate 15 as far as the top side of the substrate 15. The substrate 15 is then etched out to a defined depth, which results from the envisaged residual thickness of the substrate 15 and from the length of that portion of the metal pin which subsequently projects out from the underside of the substrate. As illustrated in FIG. 10, a dielectric 6 is deposited (for example oxide by means of PECVD) into the etched opening and anisotropically removed from the surface and from the bottom of the etched-out region. This dielectric 6 is then removed in accordance with FIG. 11 in the region of the metal plane 3 with which contact is to be made. This can be carried out, for example, by filling the etched opening partially, that is to say to a level below the metal plane 3 with which contact is to be made, with a mask 7 made, for example, of resist and removing, by means of isotropic etching, the material, for example oxide, of this dielectric 6 in the region situated above this mask 7. This mask 7 is subsequently likewise removed. As illustrated in FIG. 11, the dielectric 6 is situated in the lower region of the etched opening as insulation for the metal pin 8, which is to be produced, from the material of the substrate 15 and from the layer structure situated thereon. The metal pin 8 is enabled to make contact with the metal plane 3 with which contact is to be made by virtue of the electrically conductive passivation layer 5 which is exposed by the dielectric 6. The etched opening is then filled with the metal of the metal pin 8, and this can be done, for example, by depositing tungsten over the whole area by means of CVD and etching back the tungsten on the surface.

Figure 12:
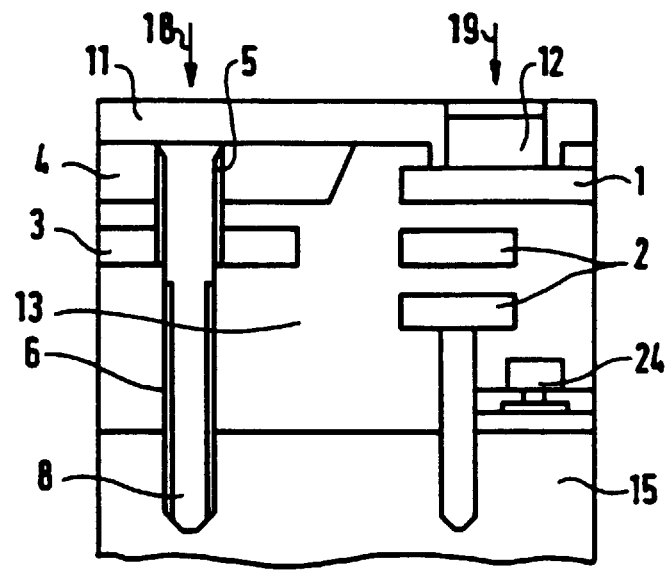

After the inventive contact structure of metal pins 8 in the lower region of the component has been produced, as illustrated in FIG. 12, the metal contacts 12 are produced on the top side for making vertical contact with metal pins of further components. The upper metal plane 1 is provided in the right-hand region of FIG. 12 (see arrow 19) with a metal contact 12 of this type. For this purpose, a covering layer 11 made of dielectric can, for example, be deposited over the whole area and planarized. The production is then continued using the customary methods for the production of metal contacts, such as a photographic technique and lift-off technique. The material of the covering layer 11 is removed in the region of the metal contact 12 to be produced and the metal is applied by vapors deposition or sputtering. As in the preceding exemplary embodiment, metal having a lower melting point than the conductor tracks is applied. The masks and excess metal on the surface are removed. The planar top side can be stabilized by applying an adhesion layer 16 and a carrier wafer 17.

Figure 13:
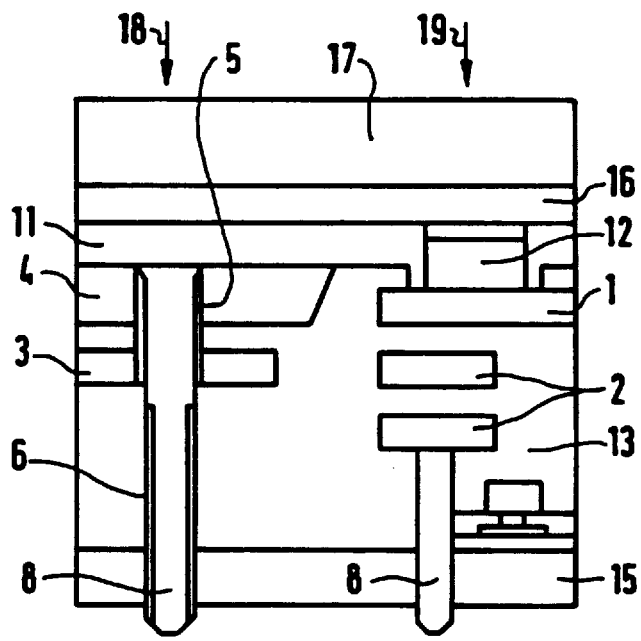

The substrate 15 is then thinned from the rear side by etching back the semiconductor material, for example by chemical mechanical polishing (CMP), until the lower tips of the metal pins 8 are exposed. It is possible to recognize that this state has been reached by the change in friction in the chemical mechanical polishing. The material of the substrate 15 is then etched back further, still in a selective manner with respect to the metal pins 8, until the ends of the metal pins 8 project in the envisaged manner beyond the underside of the substrate 15 (see FIG. 13). In this exemplary embodiment, too, this last process step can be simplified by using a multilayer substrate. Situated between an upper semiconductor layer provided with the layer structure and the actual carrier wafer made of semiconductor material is an interlayer (for example oxide) with respect to which the semiconductor material (for example silicon) of the carrier wafer can be selectively etched. The metal pins 8 are then produced in a manner projecting into the carrier wafer to such an extent that in the last process step only the carrier wafer of the substrate needs to be removed completely and selectively with respect to the interlayer. Instead of an SOI substrate with a customary, thin insulator layer, use can be made for the component according to the invention of a specially produced multilayer substrate with a considerably thicker insulator layer, in order to ensure adequate insulation of the layer structure having the functional elements from the surface layers of a further component arranged vertically underneath.

The further processing of the semiconductor component, the separation into chips and vertical connection to further components can take place as in the initially described exemplary embodiment. The passivation layer 5 and dielectric 6 on the side walls of the hole which is etched out for the metal pin 8 can also be used in the production process of the first embodiment. In this first exemplary embodiment, similar to the second exemplary embodiment, it is possible not to produce the metal pins 8 until after the application of the dielectric layers and the conductor tracks 10. The upper metal contacts for the connection to metal pins 8 of further components are expediently not produced until last on the top metal plane. The metal pins 8 can also be produced through further upper metal planes if, in the region provided for the metal pin 8, no conductor tracks or individual metal contacts are crossed in these upper metal planes, rather etching has to be carried out only through the corresponding dielectric of these layers. The production of the contact structure according to the invention can be adapted in this way to the respective layer structure of the components, and the production process can be correspondingly optimized. In this case, a layer structure in the sense of the claims is to be understood in each case as an arbitrary structure comprising semiconductor layers and/or metallization planes with contact layers made of conductively doped semiconductor material, conductor tracks and/or individual metal contacts. The electrically conductive regions are in each case isolated from one another by means of insulating dielectric. In order to simplify the production technology, it can be provided that the semiconductor components which are to be vertically interconnected with one another have the same structure and the circuitry connection is achieved by the special arrangement of the contact structure according to the invention. Each component then contains the same functional elements which, when vertically connected, are interconnected in the envisaged manner on the basis of the contact structure. A planarization layer or covering layer is to be understood in each case as a top dielectric layer or a top portion of a dielectric layer which levels the top side of the component.

Although other modifications and changes may be suggested by those skilled in the art, it is the intention of the inventors to embody within the patent warranted hereon all changes and modifications as reasonably and properly come within the scope of their contribution to the art.

We claim:

1. A process for producing a contact structure of a semiconductor component, comprising the steps of:

in a first step, producing a layer structure on a top side of a substrate to such an extent that a contact portion selected from the group consisting of: a contact layer, which is made of semiconductor material and with which a metal pin is to make contact, and a conductor track and a metal contact is present, in a second step, using a mask to remove said layer structure and the substrate in anisotropic etching steps from the top side toward an underside in a region of a metal pin to be produced, in a third step, introducing metal into said region to produce the metal pin, and in a fourth step, removing the underside of the substrate at least to a level exposing an end of the metal pin produced in the third step.

2. A process as claimed in claim 1, wherein in the first step use is made of a substrate comprising two layers of semiconductor material which are isolated by an insulator layer which is arranged to be coplanar with the top side, in the second step, the region provided for the metal pin is etched at least as far as the layer of semiconductor material forming the underside of the substrate, and in the fourth step, said layer of semiconductor material is completely removed by etching the semiconductor material selectively with respect to said insulator layer.

3. A process as claimed in claim 2, wherein the substrate is an SOI substrate, in the first step, producing functional elements in the thin silicon layer of said substrate and then applying a first dielectric layer over the top side, between the third and the fourth step, applying a second dielectric layer is applied over the top side whole area, planarizing the top side, producing openings using a mask technique, as contact holes in said second dielectric layer, filling said contact holes with metal and then producing one of conductor tracks and metal contacts in a third dielectric layer.

4. A process as claimed in claim 1, wherein the metal pin produced by carrying out the second step in such a way that in a first further step, applying a planarization layer made of a dielectric, in a second further step, etching out the region provided for the metal pin using a mask, right up to and including the conductor portion, in a third further step, providing sides of the etched-out region with a passivation layer, in a fourth further step, completely etching out the region provided for the metal pin, in a fifth further step, coating sides of the etched-out region with a dielectric and in a sixth further step, removing said dielectric using a mask in the region of the conductor portion.

5. A process as claimed in claim 1, repeating a sequence of process steps for producing a metal pin of the contact structure for making contact between different planes of the layer structure.

* * * * *